United States Patent [19]

Connolly, Jr. et al.

[11] 4,335,371
[45] Jun. 15, 1982

[54] DIGITAL ERROR CORRECTING TRIMMING IN AN ANALOG TO DIGITAL CONVERTER

[75] Inventors: Joseph J. Connolly, Jr.; Thomas P. Redfern; Thomas M. Frederiksen, all of San Jose, Calif.

[73] Assignee: National Semiconductor Corporation, Santa Clara, Calif.

[21] Appl. No.: 28,464

[22] Filed: Apr. 9, 1979

[51] Int. Cl.³ ............................................ H03K 13/08
[52] U.S. Cl. ........................ 340/347 CC; 340/347 AD; 340/347 M; 364/571
[58] Field of Search .................... 340/347 M, 347 CC; 364/571; 370/113

[56] References Cited

U.S. PATENT DOCUMENTS

| | | | |
|---|---|---|---|
| 4,031,630 | 6/1977 | Fowler | 364/571 X |
| 4,070,665 | 1/1978 | Glennon et al. | 340/347 CC X |
| 4,119,958 | 10/1978 | Simon et al. | 340/347 SY |
| 4,121,055 | 10/1978 | Doherty | 370/113 X |
| 4,131,884 | 12/1978 | Comer | 340/347 DA X |
| 4,138,671 | 2/1979 | Comer et al. | 340/347 DA |
| 4,190,854 | 2/1980 | Redfern | 357/67 X |
| 4,191,900 | 3/1980 | Redfern et al. | 307/240 X |
| 4,198,622 | 4/1980 | Connolly, Jr. et al. | 340/347 AD X |
| 4,227,185 | 10/1980 | Kronlage | 340/347 NT |

OTHER PUBLICATIONS

Weber, Large and Medium Scale Integration Devices and Applications, McGraw-Hill Book Co., 1974, pp. 118-122; 140-144; 270-274.

The Engineering Staff of Analog Devices, Inc., Analog-Digital Conversion Handbook, 6/72, pp. I-6-4-65; II-36 to 48; II-56 to 58.

*Primary Examiner*—Thomas J. Sloyan
*Attorney, Agent, or Firm*—Gail W. Woodward; James A. Sheridan; Neil B. Schulte

[57] ABSTRACT

A single chip integrated circuit analog-to-digital converter uses the successive approximation approach with resistor ladder-switching decoder digital-to-analog coverters coupled to a precision plural input comparator. An on board PROM is provided to store in digital form the information necessary to trim the digital-to-analog converters. The converter is actuated during wafer probing in the manufacturing process and the PROM is programmed with the trim information. Initially, the PROM is bypassed and the digital words needed for accurate trim applied externally. Once the correct trim words are found, the PROM is programmed with the correct words. A 13-bit converter is supplied with ten 7-bit trim words to achieve a fully trimmed product in wafer fabrication.

7 Claims, 6 Drawing Figures

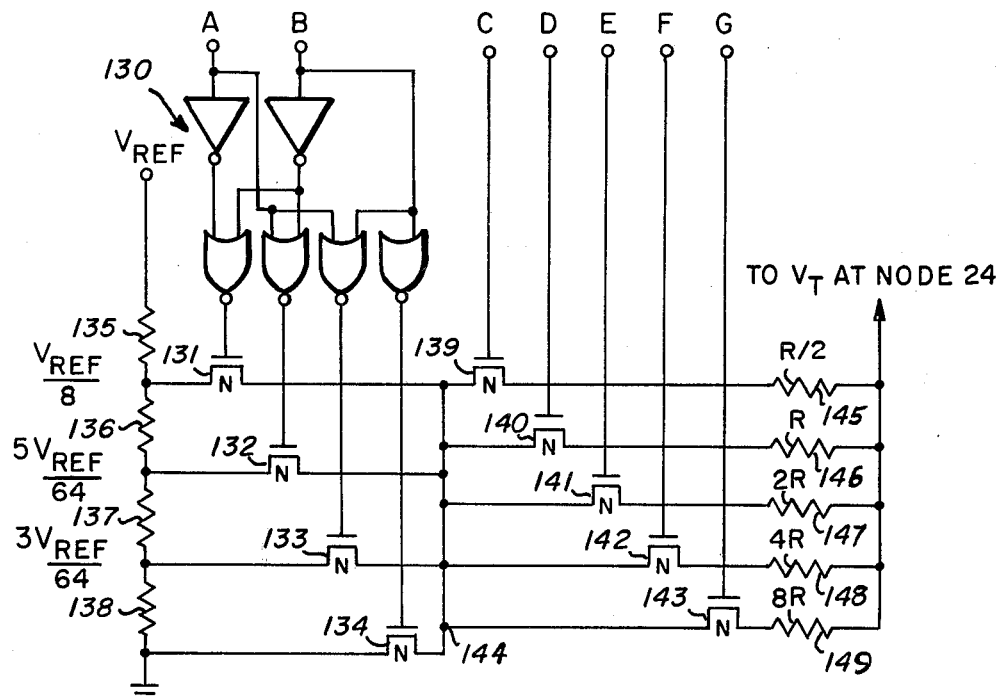
Fig_4
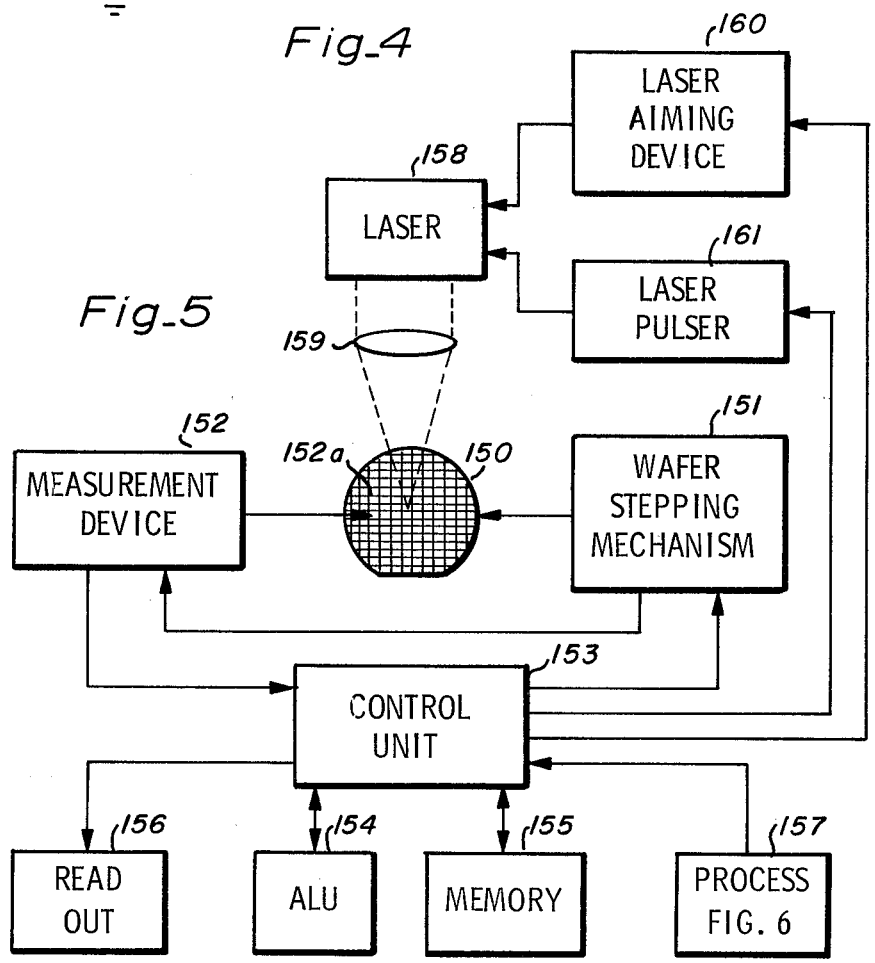
Fig_5

DIGITAL ERROR CORRECTING TRIMMING IN AN ANALOG TO DIGITAL CONVERTER

BACKGROUND OF THE INVENTION

The invention relates to an analog-to-digital (A/D) converter and is specifically directed to means for trimming the device in the form of a single chip integrated circuit (IC) in the semiconductor wafer fabrication process. The invention makes use of a Double Digital-to-Analog Converter (D-DAC) disclosed and claimed in our copending application Ser. No. 968,329 filed Dec. 11, 1978, (now U.S. Pat. No. 4,198,622) which is a continuation-in-part of application Ser. No. 879,648 filed Feb. 2, 1978 (now abandoned). These converters make use of a Precision Plural Input Voltage Amplifier and Comparator disclosed and claimed in our copending application Ser. No. 872,966 filed Jan. 27, 1978 (now U.S. Pat. No. 4,191,900). The teaching in these prior applications is incorporated herein by reference.

The prior applications disclose how a simple pair of digital-to-analog (D/A) converters can be combined to create a larger converter with the aid of a precision comparator. Thus two 3-bit D/A converters can be made to produce a 6-bit device with a great saving in parts count. It is further shown how four 3-bit D/A converters can be connected using a plural input comparator to create a 12-bit device with an even greater parts count saving.

The following chart shows the character of various D/A or A/D converters. It is assumed that a 5 volt device is to be characterized. Resolution is expressed in the number of steps associated with the converter. The error column is in % associated with $\pm\frac{1}{2}$ LSB. The last column shows the size of $\frac{1}{2}$ LSB is terms of voltage.

| BITS | RESOLUTION | ERROR (%) | $\frac{1}{2}$ LSB (mv) |
|---|---|---|---|
| 6 | 64 | 0.8 | 39 |
| 8 | 256 | 0.2 | 10 |
| 10 | 1024 | 0.05 | 2.4 |
| 12 | 4096 | 0.01 | 0.6 |
| 14 | 16384 | 0.003 | 0.15 |

It can be seen that even an 8-bit device must be constructed to better than 0.2% overall tolerance if its full capability is to be available. This sort of tolerance is at best difficult to achieve in production. Clearly, a 3-bit device would be relatively easy to build and four 3-bit devices can be built on an IC chip so they closely match. Thus, it is only necessary to trim three of the four devices so that all four match. As shown in our U.S. Pat. No. 4,198,622, a 12-bit A/D converter can be fabricated on a single IC chip. However, to achieve a 12-bit accuracy in mass production some sort of trimming would be necessary. For example, a laser can be used, as is well-known in the art, to trim resistors. Alternatively, the capacitors in the plural input comparator could be laser trimmed for balancing the two D-DAC's. One form of capacitor trimming is disclosed and claimed in copending application of Thomas P. Redfern titled TRIM STRUCTURE FOR INTEGRATED CAPACITORS Ser. No. 877,915 filed Feb. 15, 1978 (now U.S. Pat. No. 4,190,854).

Resistor trimming can be accomplished to a high degree of accuracy. For example, a film resistor can be made to have a lower than desired value and a laser beam or abrasive blast used to remove a portion of the film, thus raising its value. The trim can be done while monitoring resistance to achieve close tolerance. However, it has been found that such trimmed resistors may drift after trimming and such drifting can be accelerated by thermal cycling. This makes long-term accuracy difficult to achieve. It is far more desirable to employ digital trimming where an element is either present or absent. For example, fusible links can be used to join a group of resistors in a series parallel combination, the total value of which can be varied by selective fuse link blowing. While this results in a step wise change of parameter, once the step is achieved it will not drift as a result of trimming. Furthermore, by a careful design of the network, a useful range of trim and precision can be achieved. Also, numerous equivalents of fusible links are available in the art.

SUMMARY OF THE INVENTION

It is an object of the invention to provide accurate on chip trimming for an A/D converter IC chip.

It is a further object of the invention to include a ROM on an A/D converter IC chip whereby digital trimming can be employed.

It is a still further object of the invention to employ a PROM on an A/D converter IC chip along with means to temporarily program a trimming operation that can be permanently installed once the temporary program is found to be suitable.

These and other objects are achieved in the following configuration. An A/D converter is designed into an IC chip using a pair of D-DAC sections operating in conjunction with a plural input comparator. A control logic unit (CLU) generates the digital word that is to be the A/D output. The various bits in this word are parceled out to the appropriate D-DAC sections. A reference voltage ($V_{REF}$) is applied to the most significant D-DAC (MSD) and a fraction of $V_{REF}$ is applied to the least significant D-DAC (LSD). The fraction is weighted in accordance with the bit distribution. Using an assembly of four 3-bit elements making up two 6-bit D-DAC's, would involve a weighting of 64:1 so that $V_{REF}/8$ would be applied to the LSD and comparator C weighting of 8:1. The analog input is coupled to one pair of comparator inputs and the individual D-DAC's coupled to other input pairs which are weighted in accordance with the D-DAC weighting. The LSD is also provided with a second decoder set to create a dual D-DAC as disclosed in U.S. Pat. No. 4,198,622. These decoders are coupled to an additional suitably weighted pair of inputs on the comparator.

A read only memory (ROM) is included on chip for digital trimming. The ROM is preferred to be a laser trimmed programmable device hereinafter referred to as LPROM. In the present invention two memory sections are contained in a single structure, one for trimming the MSD and one for trimming the LSD, The LPROM is addressed using the four most significant bits of the digital word from the CLU. The address section produces a seven bit response in each of nine locations. The first six bits are used to program the second decoder group of the LSD. The seventh bit controls the polarity of corrective signal applied to the comparator.

The LPROM LSD trim section involves a single seven bit word that is decoded and used to operate a trim section that adjusts the precise value of the fraction of $V_{REF}$ applied to the LSD.

From the above, it can be seen that the LSD is trimmed to precisely represent a single bit step of the MSD. The MSD is trimmed so that the three most significant word bits are adjusted. Thus, the device is trimmed in response to digital instructions so that each of the digital representations of the analog input is accurate to better than $\frac{1}{2}$ LSB.

The LPROM programming is accomplished by means of nine IC chip pads, each of which can be probe contacted during wafer fabrication. Two of the pads permit selection of either the MSD trim section or the LSD trim section. The other seven pads permit creation of the digital trim words. The selection pads permit override of the appropriate memory contents. That is, prior to programming the memory, when a selection pad is energized, the word content inserted into the seven word pads will operate the relevant trim. In operation, a selection pad is activated and the digital word manipulated until the desired trim value is achieved. This would be indicated when the correct A/D digital output is generated in response to a particular analog input. The word is noted and the LPROM programmed by means of laser severed conductor links. Thus, the correct digital word is programmed into the LPROM. The LSD LPROM section is programmed with a single seven bit word while the MSD LPROM is similarly programmed with nine digital words which represent the three most significant bit positions representing 8 words of the digital word plus the offset 9th word. Once the three MSB's are trimmed, the inherent accuracy of resistor manufacturing will ensure that all bit combinations are accurate to less than $\frac{1}{2}$ LSB.

BRIEF DESCRIPTION OF THE DRAWING

FIG. 4 is a logic-schematic diagram of the trim net of FIG. 1 and the associated decoder;

FIG. 5 is a block diagram showing the parts in a wafer testing device; and

DESCRIPTION OF THE INVENTION

In the description to follow, conventional CMOS technology, as is well-known in the art, will be assumed even though other IC technologies could be employed. In decoders, switches, and other logic shown, conventional switching is intended. For example, a simple switch can be an N-channel transistor, a P-channel transistor or a CMOS transmission gate as desired. The resistors to be shown are desirably an alloy of silicon and chromium deposited in thin film form on top of the conventional passivating or field oxide on the IC chip. Such resistors can be manufactured to relatively close tolerances and are easily severed with a relatively low power laser beam. However, other forms of resistor construction can be employed. Since the device fabrication and configuration technologies are well-known, they will not be detailed herein. The device configurations shown are intended to portray a combination of elements that results in a novel, useful, and unobvious structure.

Figure 1:
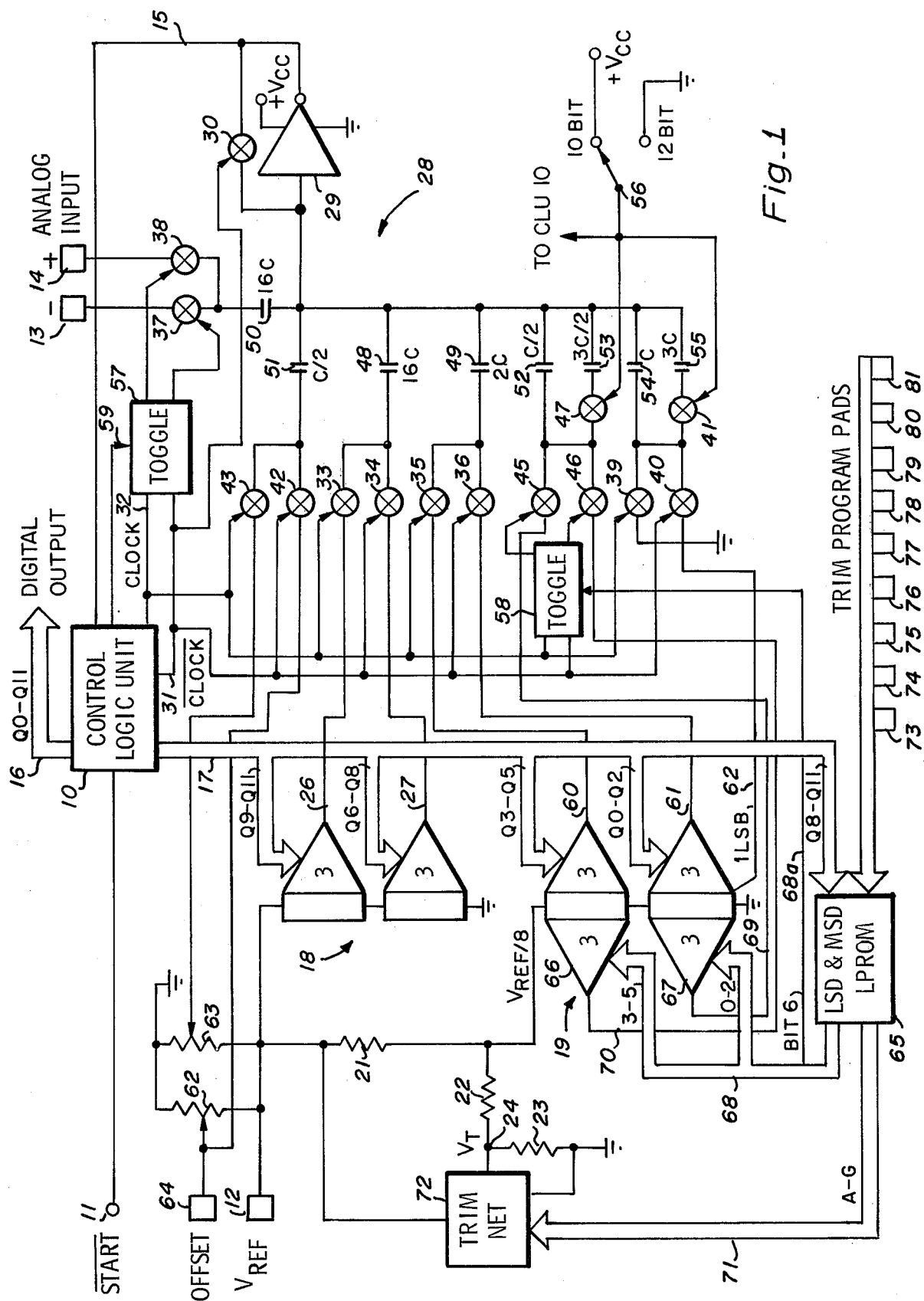
FIG. 1 is a logic diagram showing a preferred embodiment of the invention.

FIG. 1 shows the various elements of the preferred embodiment. The device is basically a 12-bit A/D converter which by virtue of a polarity determination capability is technically a 13-bit device. By a simple expedient that will be described hereinafter, it is easily converted into a 10-bit A/D converter which by virtue of the polarity control is technically an 11-bit device.

The basic control logic unit (CLU) at 10 uses the successive approximation register (SAR) approach as is found in the well-known commercially available devices such as the MM54C905. A suitable clock signal is fed to the SAR and upon a $\overline{\text{START}}$ command at terminal 11, proceeds to generate a sequence of 13-bit words in accordance with the well-known successive approximation scheme. For example, after the first bit, sign determination bit, the second bit represents $\frac{1}{2}$ full scale (or $\frac{1}{2}$ of the $V_{REF}$ value fed into terminal 12). Depending upon whether the input applied to terminals 13-14 is greater or less than $\frac{1}{2}$ $V_{REF}$, the comparator output on line 15 will instruct the SAR to keep or reset the present bit. When the SAR has produced the word most nearly approximating the analog input, the conversion is completed and the digital word is available as an output on the lines of bus 16.

The 12-bit digital word bits are designated as Q0 for the LSB through Q11 for the MSB. The bits are distributed on bus 17 to a pair of D-DACs 18 and 19. Each D-DAC comprises a pair of 3-bit D/A converters as shown. D-DAC 18 receives the six MSBs Q6–Q11 and is coupled directly to $V_{REF}$ at terminal 12. D-DAC 19 also comprises a pair of 3-bit D/A converters and receives the six LSBs Q0–Q5 as shown. D-DAC 19 is coupled via resistors 21, 22, and 23 to receive $\frac{1}{8}$ $V_{REF}$. Resistors 22 and 23 are made equal so that node 24, labeled $V_T$, is operating at $V_{REF}/16$. As will be described in detail hereinafter, node 24 is used as a trim point for trimming D-DAC 19. D-DAC 18 will hereinafter be referred to as the MSD and D-DAC 19 will be referred to as the LSD.

The MSD 18 has a pair of outputs on lines 26 and 27 and these lines comprise a pair of inputs of the plural input comparator 28. The comparator employs a high gain a-c inverting amplifier 29 with a shorting switch 30 coupled between input and output terminals. Switch 30 periodically forces amplifier 29 to its trip point which in CMOS devices is located in the center of its linear response and at the maximum gain point. While only a single such amplifier is shown, a plurality of such devices, each with its own shorting switch, can be cascaded with ac coupling to achieve the desired overall gain value. The switch 30 (and any other cascaded amplifier switches) is operated from the CLU $\overline{\text{CLOCK}}$ line 31.

MSD output lines 26 and 27 are connected to switches 33 and 34 respectively which are operated by the complementary clock line 32 and 31 signals. These switches comprise a pair of inputs to comparator 28 and are coupled via capacitor 48 to amplifier 29. Similarly LSD output lines 60 and 61 are connected to switches 35–36 which comprise another comparator 28 input pair coupled by capacitor 49 to amplifier 28. Since the LSD receives $\frac{1}{8}$ $V_{REF}$ and since capacitor 49 is $\frac{1}{8}$ of that of capacitor 48, the LSD response is weighted at 1/64 of that of the MSD. As noted above, a 6-bit DAC has a 64 step response. The LSD, therefore, represents a single step of the MSD.

The analog input at terminals 13 and 14 is coupled via input switch pair 37 and 38 to capacitor 50 and thence to amplifier 29. Since capacitors 48 and 50 are equal, the analog input response has equal weighting with respect to MSD 18. However, it can be seen that a toggle 57 is inserted between clock lines 31 and 32 and switches 37 and 38. If toggle 57 is quiescent, the input sense to terminals 13 and 14 is straight through. If the toggle is actuated by a signal on line 59, the input polarity sense at terminals 13 and 14 is reversed. Thus, if desired, the CLU can be made to provide autopolarity control and in effect add a bit to the converter capability, thereby making the 12-bit converter have a 13-bit capability.

Switches 39 and 40 constitute another input pair to comparator 28. This input is employed to provide a ½ LSB shift for the A/D conversion. A one LSB signal is obtained from the LSD 19 and is coupled via line 62 to switch 40. Switch 39 references the LSB to ground. Switches 39 and 40 are coupled via capacitor 54 to amplifier 29. Since capacitor 54 is one half the value of capacitor 49, which weights LSD 19, the single bit on line 62 produces a ½ LSB shift in comparator 29. In the event that the converter is to be used as a 10-bit device, switch 56 will couple $+V_{CC}$ to switch 41. This will couple capacitor 55 in parallel with capacitor 54 and provide an LSB weighting of twice that for the LSD 19. Thus, the ½ LSB shift is four times greater in the 10-bit device than in the 12-bit device.

Switches 42 and 43 provide still another input pair for comparator 28. This input is coupled via capacitor 51 to amplifier 29 and, since capacitor 51 is 1/32 the value of capacitor 48, is weighted to have 1/32 the effect of the MSD. Switches 43 and 42 are coupled to an offset trim device comprising resistors 62 and 63. These resistors are shown variable because they can be trimmed (after the A/D converter is manufactured) for offset. If desired, resistor 63 is adjusted to provide a zero offset for the converter. Alternatively, a predetermined zero can be inserted into the system via pad 64.

Thus far, a 12-bit A/D converter (switchable to 10 bits) and capable of operating at 13 bits (or 11 bits, if switched) has been described using a pair of D-DACs and a plural input comparator with SAR logic. The precision trimming of the structure will now be described.

An on chip PROM is employed to achieve digital trimming. Since the preferred device is to be laser programmed, it is referred to as LPROM 65. The device to be described contains a seventy bit memory. MSD LPROM section 66 (see FIG. 2) stores nine 7-bit words with the locations being addressed by means of the four MSBs Q8–Q11 of the 12-bit word on bus 17. The 7-bit words from LPROM section 66 are shown as bit combinations 0–6 on bus 68. Bits 0–5 are applied to decoders 66 and 67 (via bus 68) which are coupled to LSD 19 which is thereby in the form of a dual D-DAC. While decoders 66 and 67 are coupled to the LSD 19, they will have no significance on the outputs of lines 60 and 61. Decoders 66 and 67 have output lines 69 and 70 connected to switches 45 and 46 which comprise still another input pair for comparator 28. Capacitor 52 couples this input pair to amplifier 29, so that comparator response weighting will be 1/32 relative to the MSD 18 input. (Capacitor 52 is 1/32 the value of capacitor 48.) Since $V_{REF}/8$ is coupled via decoders 66 and 67, the overall weighting will be 1/256. Hence, the trim range is 16 LSB (1/256–1/4096) with ¼ LSB resolution (16LSB/$2^6$). Bit 6 of the 7-bit word is connected via line 68a to toggle 58 which acts to control the clock phases to switches 45 and 46. This means that bit 6 controls the trim polarity, that is whether the trim is to be added or subtracted, while bits 0–5 determine the magnitude of the trim via decoders 66 and 67.

In the event the converter is to be converted from a 12-bit device to a 10-bit device and switch 56 is operated in the 10-bit position, switch 47 is turned on, thus coupling capacitor 53 in parallel with capacitor 56. This makes the weighting capacitance four times as large which has the effect of increasing the trim magnitude by 4:1 as would be needed in a 10-bit converter.

Figure 3:
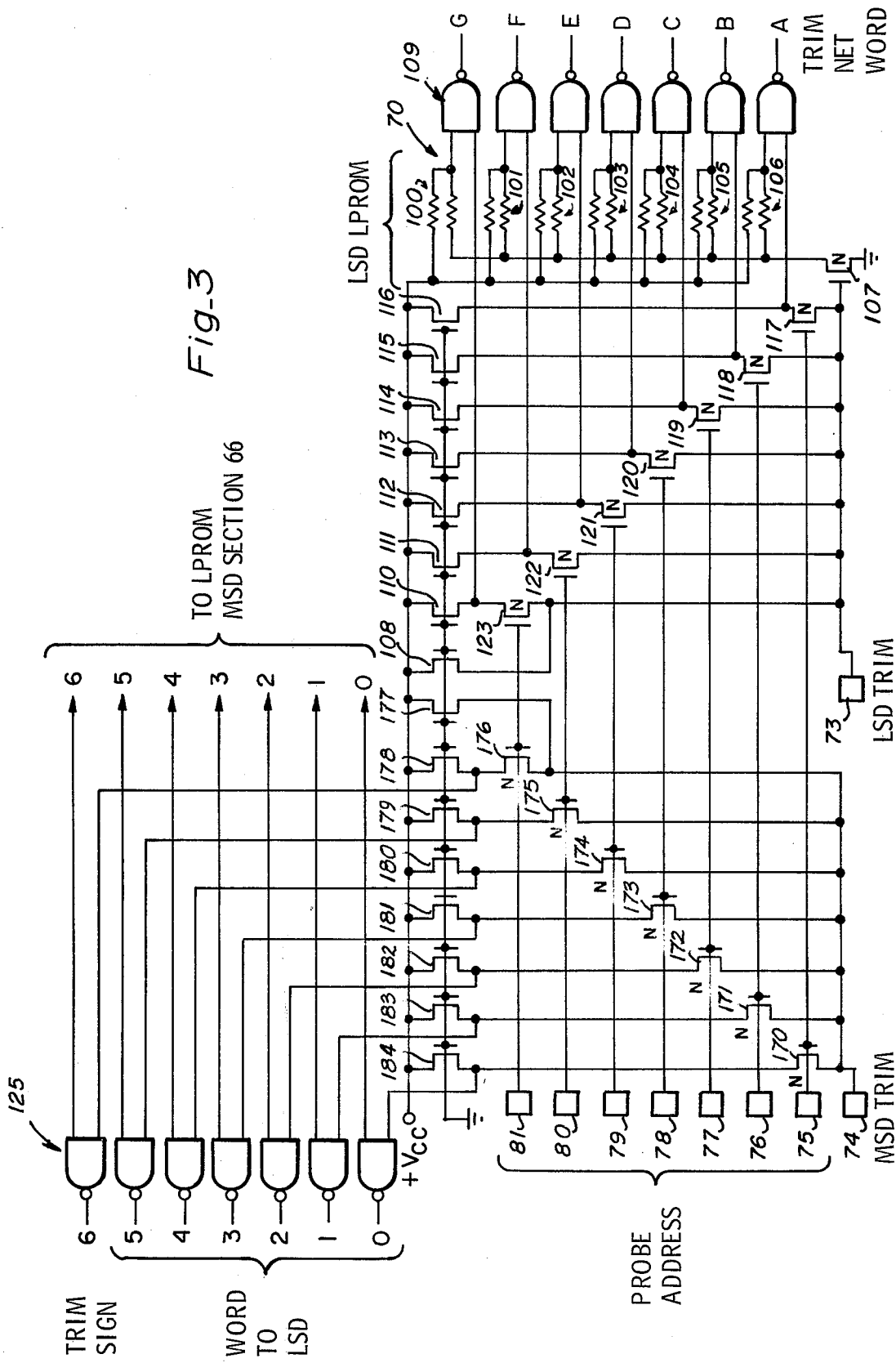
FIG. 3 is a logic-schematic diagram of the LPROM programming, LSD word decoder, and LSD memory and decoder sections of the LPROM of FIG. 1.

LPROM 65 also contains a second or LSD memory section 70 (FIG. 3). This section includes a single 7-bit word storage with the bits labeled A–G on bus 71. This bus couples to trim net 72 (see FIG. 4) which decodes LSD trim word bits A–G and applies a correction to node 24 as $V_T$. In effect, the actual value of $V_{REF}/8$ is varied by trim net 72 as instructed by the digital word contained in the LSD section 70 of LPROM 65.

Both sections 66 and 70 of LPROM 65 can initially be bypassed and their word content simulated by means of probe pads 73–81. Seven of these pads are used to simulate a 7-bit word while the other two pads can be actuated to simulate either of the two LPROM 65 sections.

When the IC is being evaluated at wafer die sort, the individual chips can be programmed. The LSD PROM section 70 is simulated and a word is found for trim net 72 that calibrates LSD 19. Once the correct word is found, that word is laser trimmed or entered into the memory to provide permanent calibration. Then the MSD PROM section 66 is simulated and the nine word locations (determined in accordance with the four MSBs Q8–Q11), selected in a sequence. The nine words associated with the MSBs are found which precisely trim the converter and these words are then entered into section 66 by laser trimming. It has been found that a nine-word memory for trimming the MSD 18 performance is normally adequate to achieve better than ½ LSB accuracy in the A/D converter. Since this is done at wafer die sort, it can be mechanized and will result in a very high yield of useful 12-bit converters that can be packaged and used without any further trimming.

Figure 2:
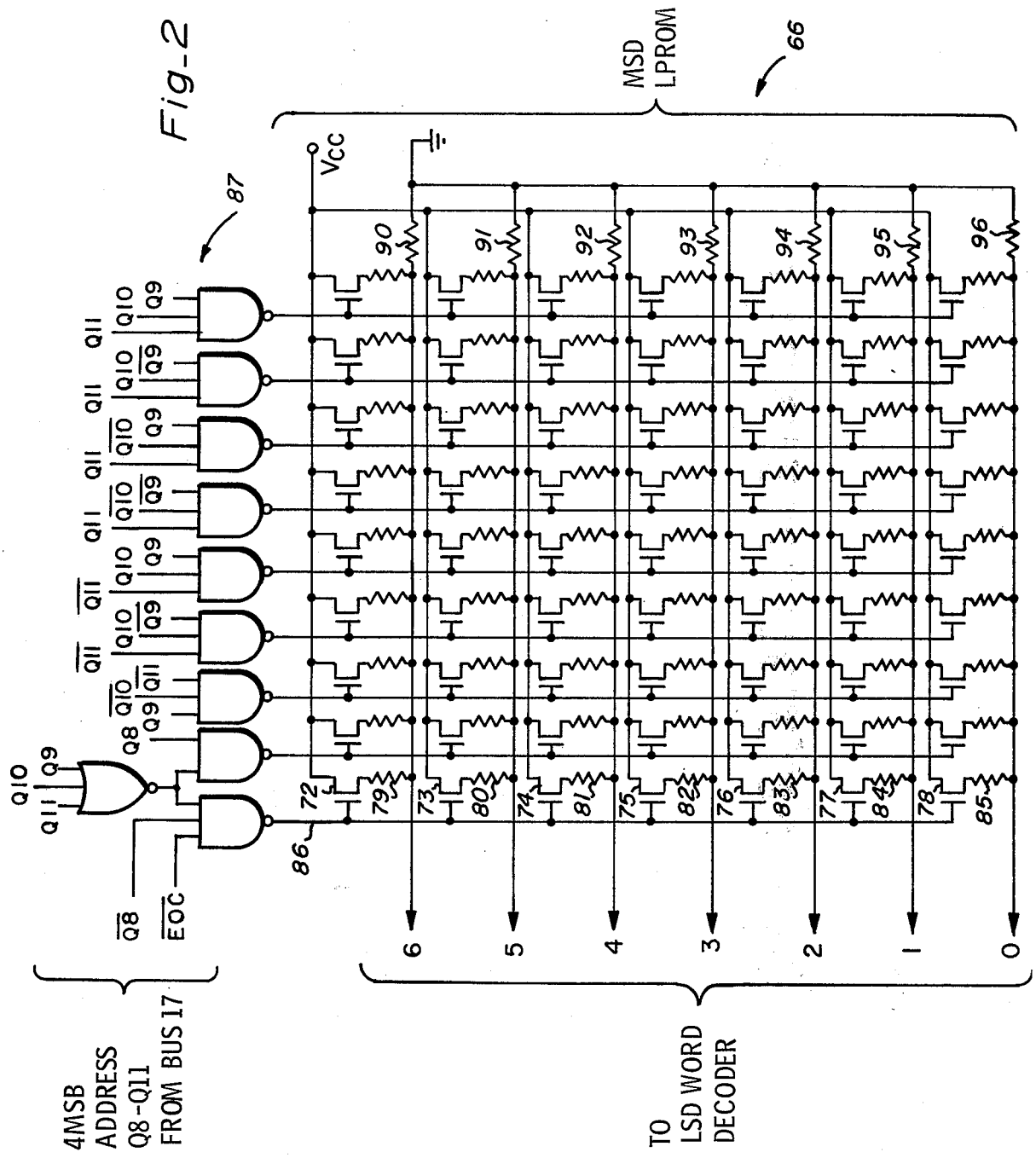
FIG. 2 is a logic-schematic diagram of the decoder and memory of the MSD section of the LPROM of FIG. 1.

FIG. 2 shows the details of the memory and address portion of the MSD LPROM section 66. The memory section 66 contains 63 p-channel transistors arrayed in seven rows of nine each. Only one column of transistors 72–78 will be described in detail because each column operates in the same way. The seven transistor gates are driven in parallel from decoder 87 which responds to the digital word MSBs Q8 through Q11. The decoder outputs are all high except for one which is selected by bit content. The high state will turn off all of the associated p-channel transistors. For this discussion column line 86 will be assumed to be low, which turns transistors 72–78 on. Each memory bit location transistor has a small si-chrome resistor associated with its drain electrode and the other end of each resistor connects to a separate row or bit line. These resistors are located on top of the IC oxide where they can be exposed to a laser beam. They are low in ohmic value and can be selectively laser severed as desired. Each row of memory elements has a separate resistor connected to ground. These resistors 90–96 have an ohmic value that is large with respect to the values of resistors 79–85 and are not subjected to laser trimming. The source electrodes of all of the memory bit transistors are connected to $+V_{CC}$. Thus, the output lines associated with word line bits 0–6 will be pulled close to $+V_{CC}$ and will all represent logic "ones." If desired, any one or all of resistors 79-85 can be severed with a laser beam. The line (or lines) associated with that resistor (or resistors) severed will be pulled to ground potential to register a logic "zero." Thus, memory section 66 is fully laser programmable.

It is to be understood that while an LPROM is preferred, any other form of PROM could be employed. For example, floating gate, bipolar transistor, fuse link, diode or other programmable devices can be used. Since trimming is a one time operation, reprogramming is not required.

FIG. 3 shows the remainder of LPROM 65. The LSD section 70 memory consists of seven pairs of resistors 100-106 coupled between $+V_{CC}$ and the drain of transistor 107. Normally transistor 108, acting as a pull up device, will pull the gate of transistor 107 high to turn it on, thus substantially grounding one element in each resistor pair. In each resistor pair the one coupled to $+V_{CC}$ is made much larger in value than its companion. This means that with all resistors intact when transistor 107 is on the resistor pair nodal points will all be low or at logic "zero." To program the section 70 memory a logic "one" is entered by severing the resistor of the pair connected to transistor 107 (the smaller of the two resistors). The remaining resistor will pull the nodal point high. Each resistor pair nodal point is connected to one input of a NAND gate in LSD memory decoder 109. Each NAND gate has its second input connected to a pull up transistor in the group 110-116. Thus, the gates in decoder 109 will act as simple inverters as long as transistor 107 is on. A group of N-channel transistors 117-123 are coupled between pad 73 and the second inputs of the NAND gates. The gates of transistors 117-123 are coupled to pads 75-81 respectively. Since transistor 108 normally pulls pad 73 high, transistors 110-116 will normally be inoperative. Normally the contents of the LSD memory section 70 will appear as a 7-bit word out of decoder 109 including the bits labeled A-G.

When it is desired to simulate the contents of memory section 70, pad 73 is grounded via an associated probe (not shown). This turns transistor 107 off and the $+V_{CC}$ connected resistors in pairs 100-106 will pull the memory connected inputs in each gate in decoder 109 high. The NAND gates will now function to reproduce the externally programmed "ones" and "zeros" forced at pads 75-81. Probes (not shown) are connected to pads 75-81 so that any digital word can be simulated. Since each NAND gate acts as a simple inverter and an inverting transistor is interposed, the bit content of the words inserted via pads 75-81 appear out of decoder 109.

The MSD memory section 66 shown in FIG. 2 indicated seven rows. These rows couple to decoder 125 (FIG. 3) which produces the 7-bit words from the memory. Decoder 125 includes seven NAND gates, one input of each being connected to one row of elements in memory 66. Each of the other inputs of the NAND gates is coupled to a pull-up transistor in the group 178-184. Each of the pull-up transistors is coupled to an N-channel transistor drain in one of transistors 170-176, the sources of which are commonly connected to pad 74. Pull-up transistor 177 will normally pull pad 74 high, thus disabling transistors 170-176. This means that normally one input on each NAND gate in decoder 125 is high and each will therefore act as a simple inverter and act to repeat (with an inversion) the "ones" and "zeros" in memory section 66.

As explained above, prior to programming, all of the rows in memory 66 will be high. For this condition the other input on each of the NAND gates in decoder 125 will act as simple inverters in response to the state of the associated probe address pad. Thus, if pad 74 is grounded by means of a probe (not shown), it can be seen that address pads 75-81 can be probed and used to apply an externally developed word via transistors 170-176 to the NAND gates in decoder 125. Thus, MSD trim pad 74 can be employed to temporarily bypass memory section 66 and pads 75-81 used to simulate a memory word. Then as the various columns of section 66 are addressed from decoder 87 an externally selected word suitable for trimming can be found and the memory laser trimmed to reproduce the required word. After trimming, memory sections 66 and 70 will serve as a permanently programmed read only memory that provides the required system trim information.

FIG. 4 is a detailed showing of the contents of trim net 72 of FIG. 1. The 7-bit digital input word containing bits A-G is received from decoder 109 of FIG. 3. Bits A and B are decoded separately in decoder 130 which operates to select any one of four transistors 131-134. These transistors are connected to a voltage divider that is coupled to $V_{REF}$ and contains three output taps plus ground. Resistors 135-138 are selected so that $V_{REF}/8$ appears at the upper tap, $5/64\ V_{REF}$ and $3/64\ V_{REF}$ are respectively coupled to transistors 132 and 133. It will be noted that $V_T$ node 24 as described above with respect to FIG. 1 is nominally at $4/64\ V_{REF}$ (or $1/16\ V_{REF}$). Thus, it can be seen that node 144 can be coupled to potential points selected at $\pm 1/64\ V_{REF}$ or $\pm 4/64\ V_{REF}$ relative to $V_T$ at node 24. Where the potential is + node 144 will source current to node 24 and when the potential is − node 144 will sink current from node 24.

Word bits C, D, E, F, and G operate switches 139-143 which respectively include series resistors 145-149. These resistors are binarily weighted and connected to node 24 so that any one of five binary weighted currents can be selected for any one of the four potentials initiated by bits A and B. Where bits C-G are all zeros no current flows and this would represent the no-trim case where $V_T$ is desired to be $1/16\ V_{REF}$.

From the foregoing description it can be seen that LSD 19 is trimmed as a unit so that it matches the LSB values of MSD 18. LSD 19 is then decoded in response to the MSBs of the digital output word to develop a correction voltage that is used to compensate errors in MSD 18. Since only nine combinations representing the four MSBs are required, the entire system can be trimmed using a 70-bit LPROM.

The trimming procedure will now be described in connection with the machine shown in block form in FIG. 5. A semiconductor wafer is shown at 150. The wafer includes a series of chips each of which contains a complete A/D converter as described above. The chips are repeated on the wafer at regular intervals in an array of rows and columns that are repeated on precisely indexed centers. The wafer is mounted upon a wafer stepping mechanism 151 that can be adjusted to precisely index and repeat the chip pattern on the wafer. The wafer can be indexed one circuit at a time so that each one can successively be brought into a test position. An array of test probes 152a is located at the test position and are mounted on a measurement device 152 that can move the probes into and out of contact with the wafer. The probes are arrayed to mate with the pads on the chip and permit contact with the circuit. In operation a chip is stepped into the test position and the probes brought into contact with the chip pads. Then the measurement device applies power and signal voltages to the chip and evaluates its performance. These operations are performed in response to a control unit 153 which either contains or is connected to an ALU 154, a memory 155, a read out device 156 (such as a printer and/or display), and a program control 157 which operates the system as will be described hereinafter with respect to FIG. 6. Once the capability of the converter under test is determined it is trimmed to bring its performance to specification. To do this control unit 153 aims a laser 158 which is focused by lens 159 onto wafer 150. An X-Y motion device 160 aims the laser beam in accordance with instruction from the control unit. A pulser 161 operates the laser to accomplish trimming. Since all of the elements of FIG. 5 employ well-known technology and are available in commercial form, they will not be detailed further herein.

Figure 6:
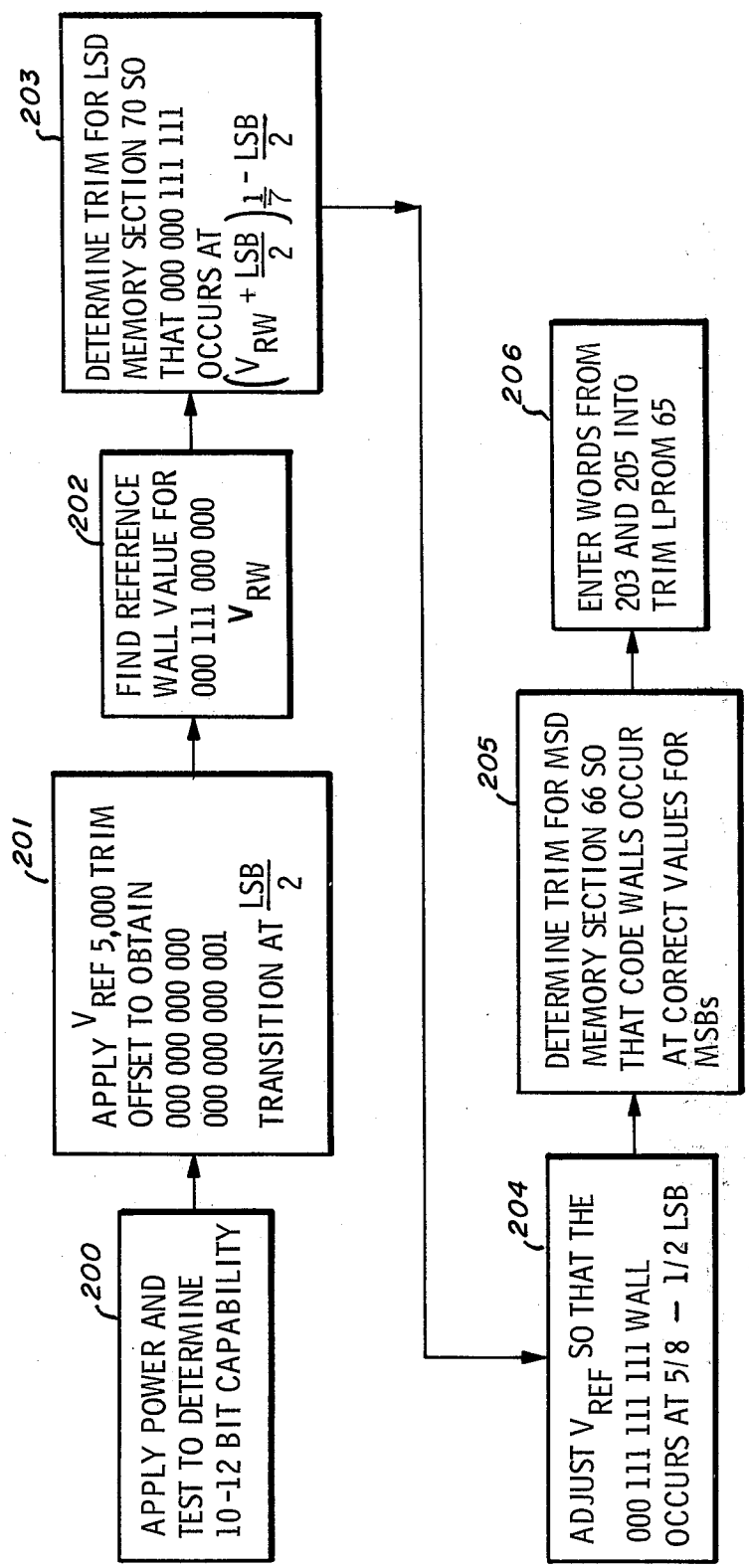
FIG. 6 is a block diagram of the digital trimming process useful in fabricating the converter of FIG. 1.

FIG. 6 is a block diagram showing the details of the trimming process. In block 200 it is assumed that the wafer is in the testing device of FIG. 5. Power is applied and the converter tested to determine errors. Here a decision is made as to whether the final unit is capable of being trimmed to 12-bit accuracy. If not, switch 56 of FIG. 1 is set, by means provided, to the 10-bit position and trimming to 10-bit accuracy performed. In the following discussion it will be assumed that 12-bit capability is indicated.

In block 201 a precise $V_{REF}$ (5.000 volts) is applied and the circuit trimmed for LSB/2 offset. This is a relatively gross adjustment and does not require high precision. Either resistor 62 or 63 of FIG. 1 (or both) can be laser trimmed for this adjustment. The procedure involves varying the analog voltage input in the range of 0.6 mV and laser trimming the resistors so that the 000 000 000 000–000 000 000 001 digital transition occurs at close to 0.6 mV. Such a transition is commonly called a "wall." This LSB/2 offset adjustment ensures that the maximum error encountered in an ideal A/D converter does not exceed LSB/2.

In block 202 the wall associated with digital output 000 111 000 000 is found. This is called $V_{RW}$. The analog input is simply varied until the wall voltage is located and the value noted. Generally speaking the wall is said to be that voltage value that causes a transition to the next lower digital word. Then as shown in block 203, memory section 70, the LSD portion of LPROM 65 is laser trimmed so that the 000 000 111 111 wall occurs at an analog voltage equal to $(V_{RW}+LSB/2)/7-LSB/2$. This ensures that LSD 19 is exactly representative of a single step in the lower portion of MSD 18.

This trim step is accomplished by grounding pad 73 and applying a digital word via probes to pads 75–81. The word is varied until the best trim is achieved.

Once the desired trim word is determined it is entered into memory 155 (of FIG. 5) for later use in the final laser trimming step which actually occurs as shown in block 206. During this part of the trim operation the laser is operated to sever resistors in memory section 70 to duplicate the desired trim word in permanently stored form. The grounds on pads 73 and the LSD trim word on pads 75–81 are retained during the next step.

Next, as shown in block 204, the exact value of $V_{REF}$ applied to pad 12 is adjusted so that the 000 111 111 111 wall occurs at an analog input of $\frac{1}{8}$ (5.000)−LSB/2. This adjusts the full scale converter response relative to the precisely trimmed (temporarily) LSD. The ground on pad 73 is removed.

The words required to precision trim MSD18 are then determined by temporarily programming the MSD memory section 66 of LPROM 65. The required trim words are stored in memory 155 for later use. There are nine steps as shown in the following chart and nine walls are precisely located. Since these digital trim values are not interactive, they can be performed in any order. The following chart shows the related wall locations.

| WALL | MEMORY WORD | VOLTAGE |
| --- | --- | --- |
| 111 100 000 000 | 9 | 15 $V_{REF}/16$ − LSB/2 |
| 110 100 000 000 | 8 | 13 $V_{REF}/16$ − LSB/2 |
| 101 100 000 000 | 7 | 11 $V_{REF}/16$ − LSB/2 |
| 100 100 000 000 | 6 | 9 $V_{REF}/16$ − LSB/2 |
| 011 100 000 000 | 5 | 7 $V_{REF}/16$ − LSB/2 |
| 010 100 000 000 | 4 | 5 $V_{REF}/16$ − LSB/2 |
| 001 100 000 000 | 3 | 3 $V_{REF}/16$ − LSB/2 |
| 000 100 000 000 | 2 | $V_{REF}/16$ − LSB/2 |
| 000 000 000 001 | 1 | LSB/2 |

Pad 74 is grounded and pads 75–81 provided with the word that most nearly trims the converter for the wall represented by the addressing of decoder 87. When the correct word is found it is entered in memory 155.

After all nine trim words have been determined and stored within memory 155, the chip is ready for programming. In block 206 LPROM 65 is programmed. Laser 158 is operated to trim resistors as outlined above in accordance with the trim words stored in memory 155. In effect the words determined in blocks 203 and 205 are permanently entered into LPROM 65.

The laser memory programming is applied to the memory in one operation and this creates a very desirable advantage. Ordinarily analog laser trimming requires a series of measure-trim-measure cycles to bring a device into specification. Unfortunately a substantial interval is needed after laser excitation for the IC to recover and stabilize because the illumination reacts with the silicon substrate. This means that one must wait after laser trimming for the circuit to recover so that the effect of the trim can be determined. The single digital laser trim avoids this problem.

Upon completion of the above described trimming procedure the A/D converter chip is fully trimmed and the next chip on the wafer can be treated. While the above procedure appears to be protracted, when it is applied to wafer testing on automatic machinery and all of the steps automated, the entire process can be done very rapidly, usually in less than one second.

When the semiconductor wafer so treated is processed into individual packaged chips, no additional trimming is needed. All the customer or user of the device has to do is apply a value of $V_{REF}$ that provides the desired full scale indication. This is normally an expected end user calibration process so it actually adds nothing extra to the use of the A/C converter.

The invention has been described, a preferred embodiment set forth, and a detailed calibration procedure presented. Clearly, there will be alternatives and equivalents within the spirit and intent of the invention that will occur to a person skilled in the art. Accordingly, it is intended that the scope of the invention be limited only by the claims that follow.

We claim:

1. A digitally trimmed analog-to-digital converter that provides a plural bit digital output word representative of an analog input voltage, said converter comprising:
   an analog-to-digital converter capable of supplying a plurality of digital output words, each one of which represents a different analog input voltage, said converter including a plurality of dual digital-to-analog converter elements commonly coupled to a comparator having a plurality of capacitor weighted charge balanced input pairs;
   means for varying the values of said analog voltages representative of particular ones of said digital output words in response to digital trim words by applying correcting voltages to selected inputs of said comparator said digital trim words including an individual trim word for each one of said particular ones of said digital output words;
   read only memory means for storing said digital trim words;
   means for addressing said read only memory means with said particular ones of said digital output words;
   means for applying the digital trim words in said read only memory to said means for varying;
   means for temporarily bypassing said read only memory;
   means for applying an externally generated digital trim word to said converter wherein said externally generated word can be manipulated to select a desired trim word; and
   means for entering said desired trim word into said read only memory.

2. The converter of claim 1 wherein said means for varying the values of said analog voltages further includes means for varying the weighting of the effect of said digital trim words as a function of the number of bits in said digital output word.

3. The converter of claim 1 wherein said means for temporarily bypassing comprise:
   means for disabling said memory means;
   means for generating a digital trim word and for varying said digital trim word to simulate the contents of said memory; and
   means for coupling said means for generating to the output portion of said memory means.

4. The converter of claim 3 further including means for switching said converter from twelve bit to ten bit operation by switching the value of said weighting capacitor in said comparator.

5. In a method for trimming an integrated circuit analog-to-digital converter in wafer form for producing a digital output word having a plurality of bits and the capability of generating a particular digital word as a function of an applied analog voltage, said converter including a capacitor weighted charge balanced comparator, memory means for storing a plurality of digital trim words, means for addressing said memory as a function of a plurality of the most significant bits of said digital output word, means for varying the response of said converter as a function of said digital trim word, and means for programming said memory means, the process steps comprising:
   locating said wafer in a probe equipped step and repeat machine;
   rendering said converter operative;
   applying an analog voltage to obtain a digital output word that includes all of said most significant bits;
   calculating the analog voltage that should be present in response to said digital word;
   temporarily bypassing said memory means;
   generating a digital trim word to simulate the contents of said memory;
   varying said generated trim word until said analog voltage most nearly equals said calculated value for said word;
   repeating said steps of applying, calculating, generating and varying for each separate digital output word that represents a combination of said most significant bits; and
   entering said words obtained in the preceding steps to program said memory means whereby said converter is trimmed.

6. The process of claim 5 wherein said converter is a twelve bit device and said memory is addressed by the four most significant bits.

7. The method of claim 6 including the step of switching said converter to ten bit operation.

* * * * *